US009917182B1

(12) United States Patent
Saito et al.

(10) Patent No.: US 9,917,182 B1
(45) Date of Patent: Mar. 13, 2018

(54) SEMICONDUCTOR DEVICE

(71) Applicant: KABUSHIKI KAISHA TOSHIBA, Minato-ku, Tokyo (JP)

(72) Inventors: Yasunobu Saito, Ishikawa (JP); Kohei Oasa, Ishikawa (JP); Takuo Kikuchi, Kanagawa (JP); Junji Kataoka, Kanagawa (JP); Tatsuya Shiraishi, Ishikawa (JP); Akira Yoshioka, Ishikawa (JP); Kazuo Saki, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/441,497

(22) Filed: Feb. 24, 2017

(30) Foreign Application Priority Data

Sep. 9, 2016 (JP) .................................. 2016-177019

(51) Int. Cl.
H01L 29/15 (2006.01)
H01L 29/778 (2006.01)
H01L 29/40 (2006.01)
H01L 29/51 (2006.01)

(52) U.S. Cl.
CPC ........ H01L 29/7787 (2013.01); H01L 29/408 (2013.01); H01L 29/518 (2013.01)

(58) Field of Classification Search
None
See application file for complete search history.

(56) References Cited

U.S. PATENT DOCUMENTS

| 8,624,260 | B2 | 1/2014 | Ramdani | |
|---|---|---|---|---|
| 9,082,836 | B2 | 7/2015 | Senda | |
| 2008/0014759 | A1* | 1/2008 | Chua | H01L 21/28202 438/763 |
| 2008/0035934 | A1* | 2/2008 | Sheppard | H01L 21/045 257/76 |
| 2010/0308373 | A1* | 12/2010 | Nagahisa | H01L 29/7787 257/192 |

(Continued)

FOREIGN PATENT DOCUMENTS

| JP | S64-080073 A | 3/1989 |
|---|---|---|
| JP | H06-085270 A | 3/1994 |

(Continued)

Primary Examiner — Ali Naraghi
(74) Attorney, Agent, or Firm — Foley & Lardner LLP

(57) ABSTRACT

A semiconductor device includes: a first nitride semiconductor layer, a second nitride semiconductor layer that is provided on the first nitride semiconductor layer and has a band gap larger than a band gap of the first nitride semiconductor layer, a gate electrode that is provided on the first nitride semiconductor layer, a first electrode that is electrically connected to the first nitride semiconductor layer, a second electrode disposed such that the gate electrode is positioned between the first electrode and the second electrode, and electrically connected to the first nitride semiconductor layer, and a first insulation layer that is provided between the gate electrode and the second electrode, disposed such that the second nitride semiconductor layer is positioned between the first nitride semiconductor layer and the first insulation layer, and including silicon oxide having an oxygen-to-silicon atomic ratio (O/Si) of 1.50 or more and 1.85 or less.

10 Claims, 10 Drawing Sheets

(56) References Cited

U.S. PATENT DOCUMENTS

| | | | |
|---|---|---|---|
| 2011/0101453 A1* | 5/2011 | Lin | H01L 21/76834 |
| | | | 257/339 |
| 2014/0246760 A1* | 9/2014 | Strassburg | H01L 21/0214 |
| | | | 257/637 |
| 2016/0049290 A1* | 2/2016 | Makiyama | H01L 23/291 |
| | | | 438/478 |
| 2016/0293724 A1* | 10/2016 | Komatani | H01L 29/66462 |
| 2017/0084730 A1* | 3/2017 | Bhalla | H01L 29/778 |

FOREIGN PATENT DOCUMENTS

| | | |
|---|---|---|
| JP | 4836111 B2 | 12/2011 |
| JP | 2013-115323 A | 6/2013 |

* cited by examiner

SEMICONDUCTOR DEVICE

CROSS-REFERENCE TO RELATED APPLICATION

This application claims the benefit of and priority to Japanese Patent Application No. 2016-177019, filed Sep. 9, 2016; the entire contents of which are incorporated herein by reference.

FIELD

Embodiments described herein relate generally to a semiconductor device.

BACKGROUND

In high electron mobility transistors (HEMTs) using a group III-V compound semiconductor, a two-dimensional electron gas (2DEG) is formed in a channel layer. The two-dimensional electron gas helps to allow for low on-state resistance and a high switching speed.

In the off-state of such a HEMT, a high voltage can be applied between a source electrode and a drain electrode, and leaked electrons are caused to flow into the drain electrode. At that time, some of the electrons can be trapped in an interface between a semiconductor layer and an insulation layer, or inside the insulation layer, and become a negative fixed charge. Because of the negative fixed charge, channel depletion occurs in an on state of the HEMT, and this may cause an increase in on-state resistance. Such a phenomenon is called current collapse.

Thus it may be desirable to prevent trapping of electrons and suppress current collapse.

SUMMARY

In some embodiments, according to one aspect, a semiconductor device includes: a first nitride semiconductor layer, a second nitride semiconductor layer that is provided on the first nitride semiconductor layer and has a band gap larger than a band gap of the first nitride semiconductor layer, a gate electrode that is provided on the first nitride semiconductor layer, a first electrode that is electrically connected to the first nitride semiconductor layer, a second electrode disposed such that the gate electrode is positioned between the first electrode and the second electrode, and electrically connected to the first nitride semiconductor layer, and a first insulation layer that is provided between the gate electrode and the second electrode, disposed such that the second nitride semiconductor layer is positioned between the first nitride semiconductor layer and the first insulation layer, and including silicon oxide having an oxygen-to-silicon atomic ratio (O/Si) of 1.50 or more and 1.85 or less.

In some embodiments, according to another aspect, a semiconductor device includes a first nitride semiconductor layer, a second nitride semiconductor layer that is provided on the first nitride semiconductor layer and has a band gap larger than a band gap of the first nitride semiconductor layer, a gate electrode that is provided on the first nitride semiconductor layer, a first electrode that is electrically connected to the first nitride semiconductor layer, a second electrode disposed such that the gate electrode is positioned between the first electrode and the second electrode, and electrically connected to the first nitride semiconductor layer, a first insulation layer that is provided between the gate electrode and the second electrode, disposed such that the second nitride semiconductor layer is positioned between the first nitride semiconductor layer and the first insulation layer, and including silicon oxide containing nitrogen, and a second insulation layer that is provided between the first insulation layer and the second electrode and includes silicon oxide having a density of nitrogen lower than the silicon oxide included in the first insulation layer.

In some embodiments, according to another aspect, a semiconductor device includes a first nitride semiconductor layer, a second nitride semiconductor layer that is provided on the first nitride semiconductor layer and has a band gap larger than a band gap of the first nitride semiconductor layer, a gate electrode that is provided on the first nitride semiconductor layer, a first electrode that is electrically connected to the first nitride semiconductor layer, a second electrode disposed such that the gate electrode is positioned between the first electrode and the second electrode, and electrically connected to the first nitride semiconductor layer, a first insulation layer that is provided between the gate electrode and the second electrode, disposed such that the second nitride semiconductor layer is positioned between the first nitride semiconductor layer and the first insulation layer, and containing positive charge, and a second insulation layer that is provided between the first insulation layer and the second electrode, disposed such that the second nitride semiconductor layer is positioned between the first nitride semiconductor layer and the second insulation layer, and having a density of positive charge lower than that of the first insulation layer.

DETAILED DESCRIPTION

Figure 1:
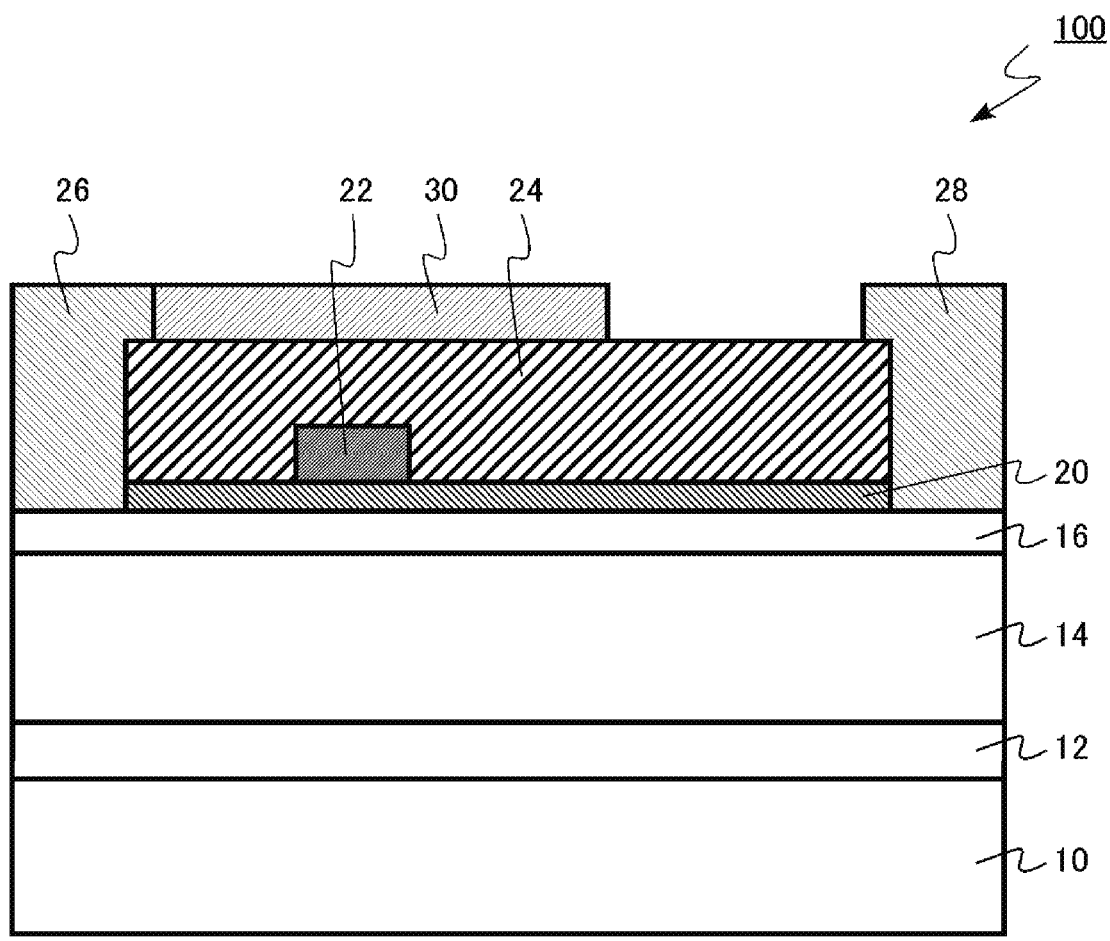
FIG. 1 is a schematic cross-sectional view of embodiments of a semiconductor device according to a first aspect.

Some embodiments provide a semiconductor device capable of suppressing current collapse.

In general, according to some embodiments, a semiconductor device includes: a first nitride semiconductor layer; a second nitride semiconductor layer that is provided on the first nitride semiconductor layer and has a band gap larger than the first nitride semiconductor layer; a gate electrode that is provided on the first nitride semiconductor layer; a first electrode that is electrically connected to the first nitride semiconductor layer; a second electrode that allows the gate electrode to be positioned between the first electrode and the second electrode and is electrically connected to the first nitride semiconductor layer; and a first insulation layer that is provided between the gate electrode and the second electrode, allows the second nitride semiconductor layer to be positioned between the first nitride semiconductor layer and the first insulation layer, and includes silicon oxide having an oxygen-to-silicon atomic ratio (O/Si) of about 1.50 or more and about 1.85 or less.

In this disclosure, corresponding (e.g. similar) elements and the like are given a same reference signs, and duplicate description thereof may not be presented.

As used in this disclosure, the term "undoped" means that an impurity concentration is about $1\times10^{15}$ cm$^{-3}$ or less.

In this disclosure, in order to represent positional relations of components and the like, an up direction as depicted in the drawings will be described as an "upper side", and a down direction as depicted in the drawings will be described as a "lower side". In this disclosure, the terms "upper side" and "lower side" are not necessarily terms representing relations with the direction of a gravitational force.

In the description of some embodiments, an element provided "on" another element can encompass cases where the former element is directly on (e.g., in physical contact with) the latter element, as well as cases where one or more intervening elements are located between the former element and the latter element.

(First Aspect)

In some embodiments according to the first aspect, a semiconductor device includes: a first nitride semiconductor layer; a second nitride semiconductor layer that is arranged (positioned) on the first nitride semiconductor layer and has a band gap larger than the first nitride semiconductor layer; a gate electrode that is arranged on the first nitride semiconductor layer; a first electrode that is electrically connected to the first nitride semiconductor layer; a second electrode that allows the gate electrode to be positioned between the first electrode and the second electrode and is electrically connected to the first nitride semiconductor layer; and a first insulation layer that is arranged between the gate electrode and the second electrode, allows the second nitride semiconductor layer to be positioned between the first nitride semiconductor layer and the first insulation layer, and includes silicon oxide having an oxygen-to-silicon atomic ratio (O/Si) of about 1.50 or more and about 1.85 or less.

FIG. 1 is a schematic cross-sectional view of some embodiments of a HEMT semiconductor device 100 (HEMT 100) according to the first aspect. The semiconductor device 100 is a HEMT using a group III-V compound semiconductor.

As illustrated in FIG. 1, the HEMT 100 includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); and a source field plate electrode 30 (third electrode).

The substrate 10 is, for example, formed using silicon having a plane orientation of (111). Materials other than silicon may be used, such as, for example, sapphire or silicon carbide.

The buffer layer 12 is arranged on the substrate 10. The buffer layer 12 may allow for alleviating a lattice mismatch between the substrate 10 and the channel layer 14. The buffer layer 12 is, for example, formed using aluminum nitride or aluminum gallium nitride.

The channel layer 14 is arranged on the buffer layer 12. The channel layer 14 may be referred to herein as an electron transport layer.

The channel layer 14 includes, for example, undoped $Al_xG_{1-x}N$ (where $0 \leq X < 1$). More specifically, for example, the channel layer 14 is undoped gallium nitride (GaN). The thickness of the channel layer 14 is, for example, about 0.1 μm or more and about 10 μm or less.

The barrier layer 16 is arranged on the channel layer 14. The barrier layer 16 may be referred to herein as an electron supply layer. A band gap of the barrier layer 16 is larger than a band gap of the channel layer 14.

The barrier layer 16 having a larger band gap than does the channel layer 14 has a lattice constant different from that of the channel layer 14 and thus, is distorted and polarized. In accordance with an internal electric field corresponding to the polarization, the band of the channel layer 14 is pressed down, and a 2DEG is formed as an inversion layer.

The barrier layer 16 is, for example, undoped $Al_YGa_{1-Y}N$ (where $0 < Y \leq 1$, and $X < Y$). The barrier layer 16 is, for example, undoped aluminum gallium nitride. More specifically, for example, the barrier layer 16 is undoped $Al_{0.2}Ga_{0.8}N$. The thickness of the barrier layer 16 is, for example, about 20 nm or more and about 50 nm or less.

Between the channel layer 14 and the barrier layer 16, a hetero-joining interface is formed. In the channel layer 14, the 2DEG is formed corresponding to polarized charge arranged in the hetero-joining interface. The 2DEG has high electron mobility and enables low on-state resistance during operation of the device and high-speed switching.

The gate insulation layer 20 is arranged on the barrier layer 16. The gate insulation layer 20 is arranged to be in contact with the barrier layer 16. The gate insulation layer 20 is arranged between the barrier layer 16 and the gate electrode 22. The gate insulation layer 20 suppresses a gate leak current of the HEMT 100.

The gate insulation layer 20 is, for example, formed using silicon nitride. A thickness of the gate insulation layer 20 is, for example, about 4 nm or more and about 20 nm or less.

The gate electrode 22 is arranged on the gate insulation layer 20. The gate electrode 22 is arranged between the source electrode 26 and the drain electrode 28.

The gate electrode 22 is, for example, a metal electrode. The gate electrode 22 has, for example, a layered structure of platinum (Pt)/gold (Au). Thicknesses of the platinum (Pt)/gold (Au) are, for example, about 50 nm/about 500 nm.

The source electrode 26 and the drain electrode 28 are arranged on the barrier layer 16. The source electrode 26 and the drain electrode 28 are, for example, metal electrodes. Each of the source electrode 26 and the drain electrode 28 has, for example, a stacked structure of titanium (Ti)/aluminum (Al)/nickel (Ni)/gold (Au). Thicknesses of the titanium (Ti)/aluminum (Al)/nickel (Ni)/gold (Au) are, for example, about 25 nm/about 300 nm/about 50 nm/about 50 nm.

The source electrode 26 and the drain electrode 28 are, for example, in contact with the barrier layer 16. Between the source electrode 26 and the drain electrode 28 and the barrier layer 16, an ohmic contact is may be formed. The source electrode 26 and the drain electrode 28 are electrically connected to the channel layer 14 via the barrier layer 16. A structure in which the source electrode 26 and the drain electrode 28 are in contact with the channel layer 14 may additionally or alternatively be employed.

A distance between the source electrode 26 and the drain electrode 28 is, for example, about 5 μm or more and about 30 μm or less.

The first insulation layer 24 is arranged on the gate electrode 22. At least a portion of the first insulation layer 24 is arranged between the gate electrode 22 and the drain electrode 28. At least a portion of the first insulation layer 24 is arranged on the gate insulation layer 20.

The first insulation layer 24 is a silicon oxide layer. The first insulation layer 24 includes silicon oxide. The principal component of the first insulation layer 24 is silicon oxide (e.g., a majority, by weight, of the first insulation layer 24 is silicon oxide). The first insulation layer 24 may additionally include other materials.

In silicon oxide included in the first insulation layer 24, an oxygen-to-silicon atomic ratio (O/Si) is about 1.50 or more and about 1.85 or less. In silicon oxide included in the first insulation layer 24, the oxygen-to-silicon atomic ratio is lower than 2. In silicon oxide included in the first insulation layer 24, oxygen is deficient compared to a stoichiometric composition of $SiO_2$.

Since oxygen is deficient, the silicon oxide layer that is included in the first insulation layer 24 contains positive charge inside of the layer. The silicon oxide layer that is the first insulation layer 24 contains positive fixed charge inside of the layer. The silicon oxide layer that is the first insulation layer 24 is positively charged.

The silicon oxide layer that is the first insulation layer 24 is, for example, formed using a plasma chemical vapor deposition (CVD) method. For example, for a CVD method involving a source gas of silicon and a source gas of oxygen, by setting a lower or reduced flow rate of the source gas of oxygen as compared to a flow rate used for forming $SiO_2$ having an oxygen-to-silicon atomic ratio of 2, a silicon oxide layer in which oxygen is deficient can be formed.

The oxygen-to-silicon atomic ratio of the silicon oxide included in the first insulation layer 24 can, for example, be acquired through calculation based on a measurement according to secondary ion mass spectrometry (SIMS). Additionally or alternatively, the atomic ratio can be acquired through a measurement according to micro auger electron spectroscopy (μAES).

The source field plate electrode 30 is arranged on the first insulation layer 24. Between the source field plate electrode 30 and the barrier layer 16, the gate electrode 22 and the first insulation layer 24 are positioned.

The source field plate electrode 30 is electrically connected to the source electrode 26. The source field plate electrode 30 is physically connected to the source electrode 26. The source field plate electrode 30 has a same electric potential as the source electrode 26.

The source field plate electrode 30 can help to alleviate the intensity of an electric field between the source electrode 26 and the drain electrode 28. Accordingly, current collapse of the HEMT 100 is suppressed. In addition, the source field plate electrode 30 improves the off-breakdown voltage (off-state breakdown voltage) of the HEMT 100.

The source field plate electrode 30 is, for example, a metal electrode. The source field plate electrode 30 has, for example, a stacked structure of titanium (Ti)/aluminum (Al)/nickel (Ni)/gold (Au).

Next, operations and effects of the semiconductor device according to some embodiments will be described.

Figure 2A:
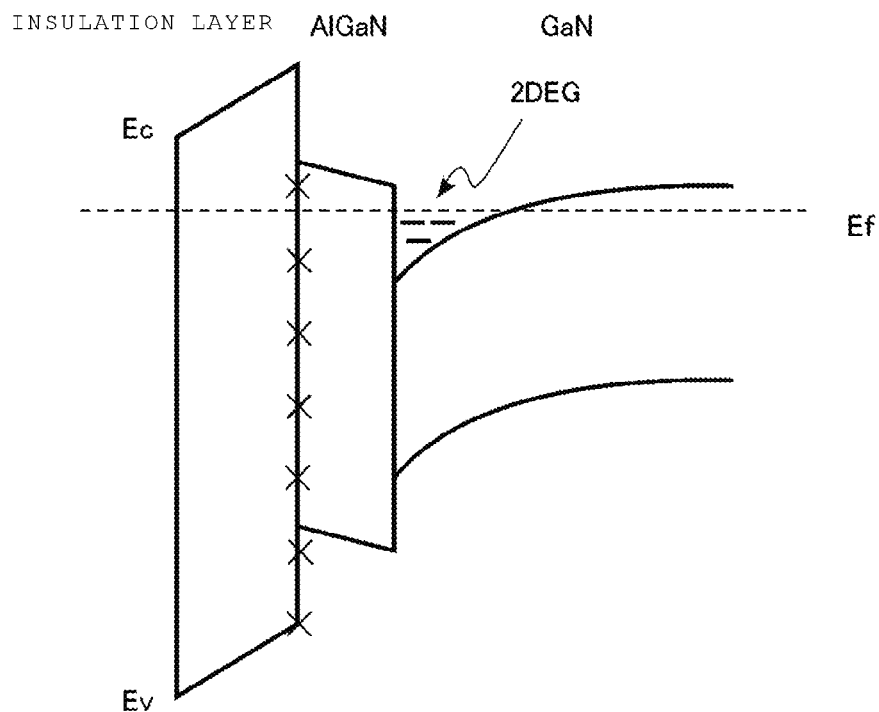
FIG. 2A and FIG. 2B are schematic diagrams that illustrate some operations and effects of embodiments of a semiconductor device according to the first aspect.
Figure 2B:
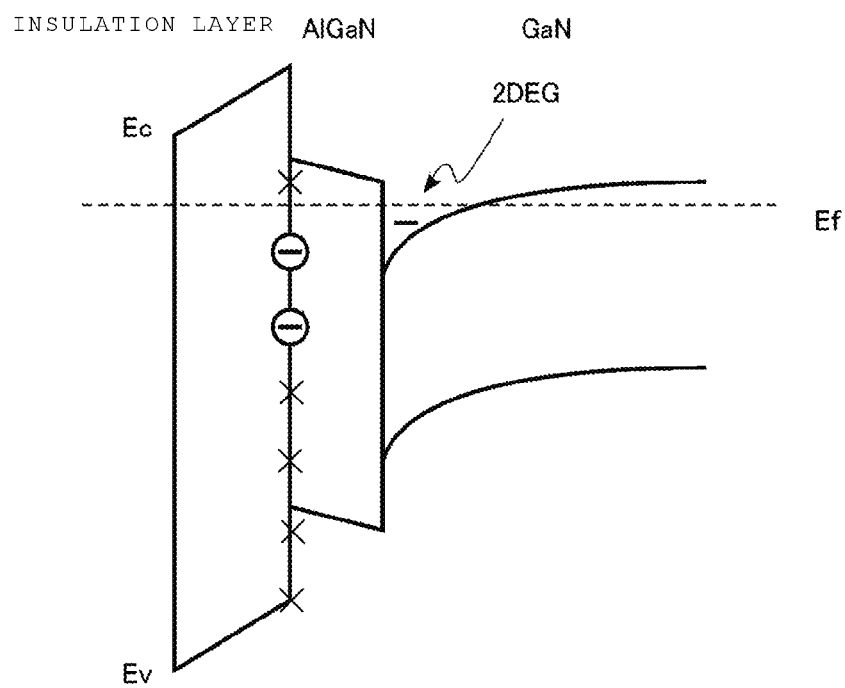
Figure 3A:
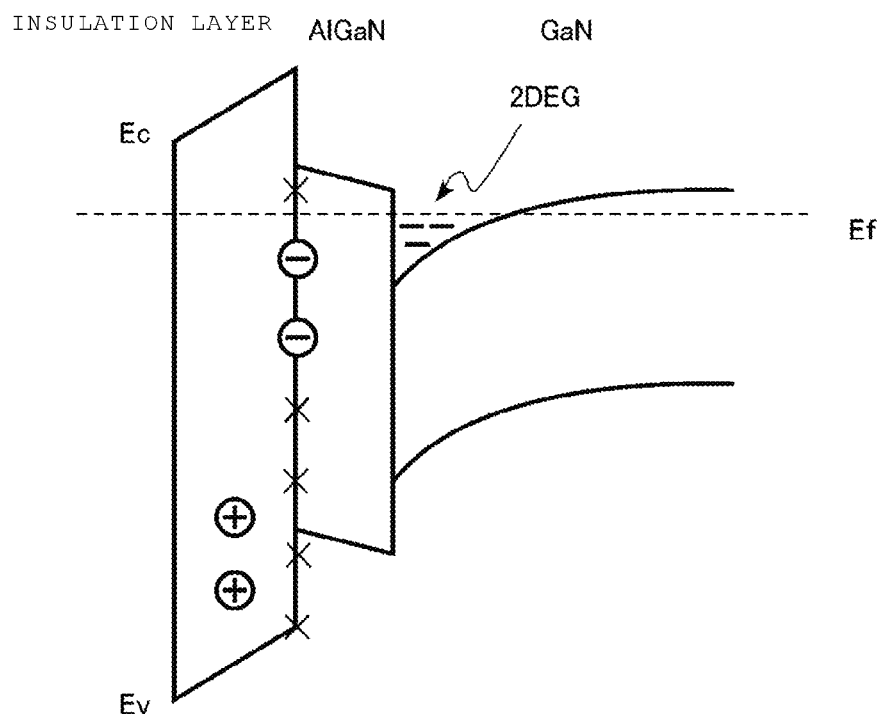
FIG. 3A and FIG. 3B are schematic diagrams that illustrate some operations and effects of embodiments of a semiconductor device according to the first aspect.
Figure 3B:
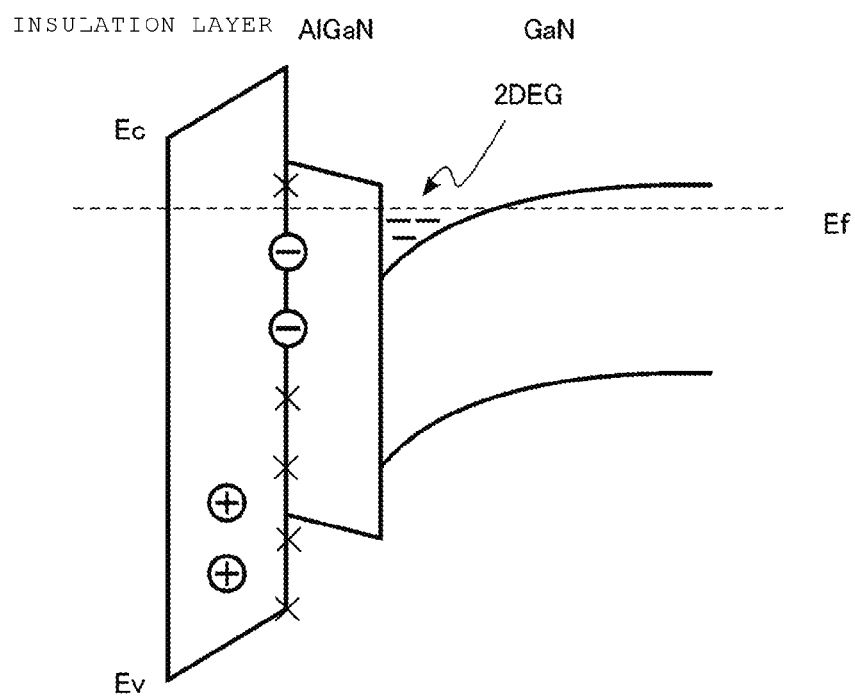

FIGS. 2A to 3B are schematic diagrams that illustrate some operations and effects of embodiments of a semiconductor device according to the first aspect. FIGS. 2A and 2B are band diagrams that illustrate a HEMT according to a comparative example, and FIGS. 3A and 3B are band diagrams that illustrate the HEMT 100 according to the first aspect.

The HEMT of the comparative example includes an insulation layer of silicon oxide having an oxygen-to-silicon atomic ratio of 2, which corresponds to a stoichiometric composition of $SiO_2$, on a gate insulation layer. In other words, an insulation layer that is not charged is included on a gate insulation layer.

FIG. 2A is the band diagram that illustrates the HEMT of the comparative example before the application of a stress. At an interface (marked with "x" in FIGS. 2A and 2B) between a AlGaN barrier layer (labeled "AlGaN" in FIGS. 2A and 2B) and a gate insulation layer (labeled "insulation layer" in FIGS. 2A and 2B), electrons are not yet trapped.

FIG. 2B is the band diagram that illustrates the HEMT of the comparative example after the application of a stress. FIG. 2B is a band diagram after the application of a high voltage between the source electrode and the drain electrode of the HEMT that is in the off state.

Due to the high voltage applied between the source electrode and the drain electrode, leaked electrons flow into the drain electrode. At an interface between the barrier layer and the gate insulation layer, some leaked electrons are trapped.

The electrons trapped at the interface form negative fixed charge. Due to this negative fixed charge, depletion of the channel occurs in the on-state of the HEMT, and a density of the 2DEG is decreased. Accordingly, the on-state resistance is increased. In other words, current collapse occurs.

FIG. 3A is a band diagram that illustrates the HEMT 100 according to the first aspect before the application of a stress. The HEMT 100 includes positive fixed charge inside an insulation layer on a gate insulation layer. Due to the positive fixed charge, the band can be compressed. Accordingly, electrons can be trapped at an interface (marked with "x" in FIGS. 3A and 3B) between a AlGaN barrier layer (labeled "AlGaN" in FIGS. 3A and 3B) and the gate insulation layer (labeled "insulation layer" in FIGS. 3A and 3B) in advance of application of a stress. The electrons trapped at the interface level form negative fixed charge.

The negative fixed charge arranged at the interface between the gate insulation layer and the insulation layer balances with the positive fixed charge arranged inside the insulation layer. Accordingly, the presence of the negative fixed charge does not cause depletion of the channel in the on-state of the HEMT 100, and there is no corresponding decrease in the density of the 2DEG.

FIG. 3B is the band diagram that illustrates the HEMT 100 according to the first aspect after the application of a stress. In the HEMT 100 according to some embodiments, an interface between the barrier layer and the gate insulation layer is filled with electrons in advance of application of stress. Accordingly, when a stress is also applied, electrons are not further trapped at the interface level. Therefore, current collapse can be suppressed.

From the viewpoint of the suppression of the current collapse, the surface density of the positive charge (positive fixed charge) arranged inside the insulation layer is preferably about $1.4 \times 10^{12}$ $cm^{-2}$ or more.

In silicon oxide included in the first insulation layer 24 according to some embodiments, the oxygen-to-silicon atomic ratio (O/Si) is about 1.50 or more and about 1.85 or less. In a case where the atomic ratio is beyond the above-described range, the amount of the positive fixed charge may be too small to function in a desired manner. Then, there is a concern that the suppression of the current collapse is insufficient. On the other hand, in a case where the atomic ratio is below the above-described range, the film quality of the first insulation layer 24 may be degraded. Then, there is a concern that the structural and/or functional reliability of the HEMT 100 is lowered.

The gate insulation layer 20 is preferably formed using silicon nitride. By forming the gate insulation layer 20 using silicon nitride, the oxidation of the barrier layer 16 at the time of manufacturing the HEMT 100 can be suppressed. In addition, when the gate insulation layer 20 is formed using silicon nitride, nitrogen can be prevented from escaping from the barrier layer 16 during manufacturing of the HEMT 100. Accordingly, a tendency of trapping nitrogen near the interface between the barrier layer 16 and the gate insulation layer 20 can be decreased.

As outlined above, according to the first aspect, a HEMT capable of suppressing current collapse is provided.

(Second Aspect)

In some embodiments, a semiconductor device according to a second aspect is similar to embodiments according to the first aspect, except that a second insulation layer is further included and is arranged between the first insulation layer and the second electrode. Furthermore, the second nitride semiconductor layer is positioned between the first nitride semiconductor layer and the second insulation layer, and the second insulation layer includes silicon oxide having an oxygen-to-silicon atomic ratio higher than that of the first insulation layer. Hereinafter, description of some components that are the same or similar to those described above with respect to the first aspect will be omitted.

Figure 4:
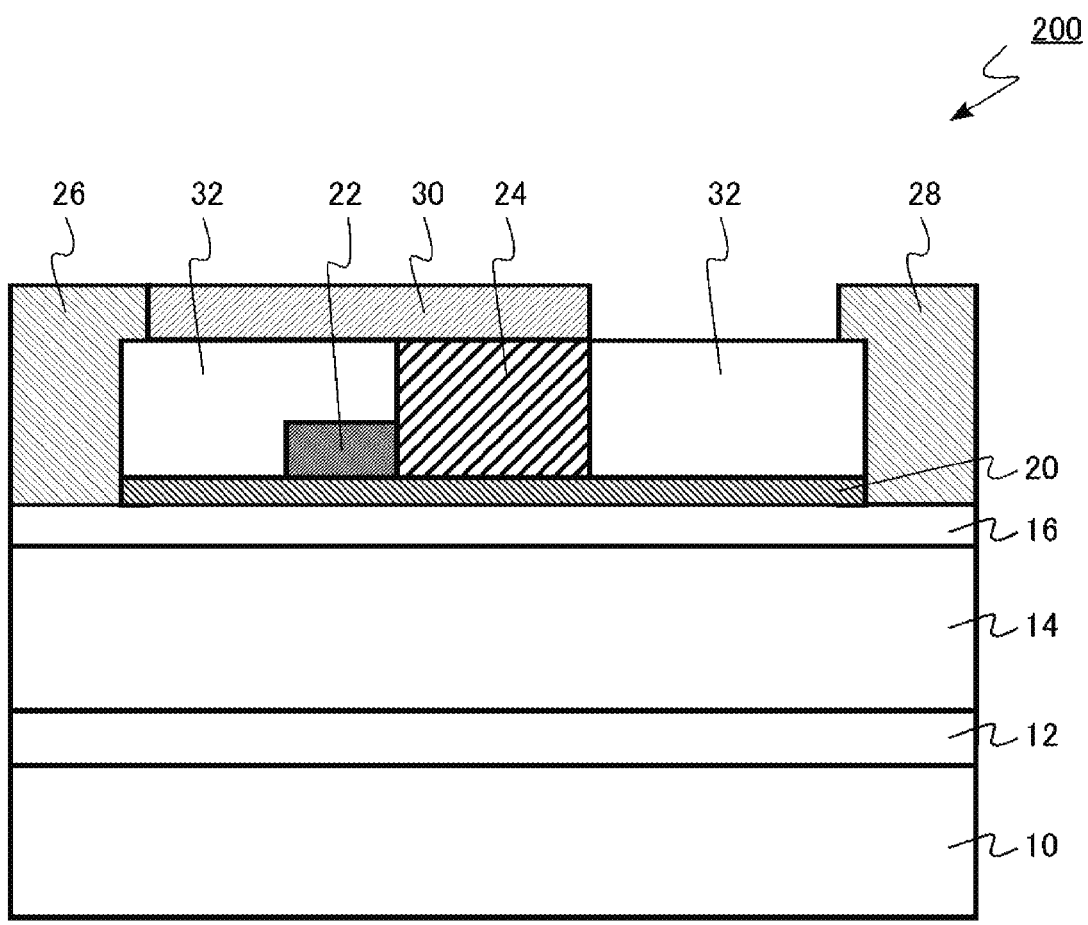
FIG. 4 is a schematic cross-sectional view of embodiments of a semiconductor device according to a second aspect.

FIG. 4 is a schematic cross-sectional view of some embodiments of a semiconductor device according to the second aspect. The semiconductor device according to the second aspect is a HEMT using a group III-V compound semiconductor.

As illustrated in FIG. 4, the HEMT 200 semiconductor device includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); a source field plate electrode 30 (third electrode), and a second insulation layer 32.

The first insulation layer 24 is horizontally (as shown in FIG. 4) arranged between an end portion of the gate electrode 22 that is on a drain electrode 28 side and an end portion of the source field plate electrode 30 that is on a drain electrode 28 side, and is arranged between the source field plate electrode 30 and the barrier layer 16. In some embodiments, the first insulation layer 24 is selectively arranged in an area between the gate electrode 22 and the drain electrode 28.

At least a portion of the second insulation layer 32 is arranged between the first insulation layer 24 and the drain electrode 28. In addition, at least a portion of the second insulation layer 32 is arranged between the first insulation layer 24 and the source electrode 26. At least a portion of the first insulation layer 24 is arranged on the gate insulation layer 20.

The second insulation layer 32 is a silicon oxide layer. The second insulation layer 32 includes silicon oxide. The principal component of the second insulation layer 32 is silicon oxide (e.g., a majority, by weight, of the second insulation layer 32 is silicon oxide). The second insulation layer 32 may additionally include other materials.

The silicon oxide included in the second insulation layer 32 has an oxygen-to-silicon atomic ratio (O/Si) higher than that of the first insulation layer 24. The oxygen-to-silicon atomic ratio of the silicon oxide included in the second insulation layer 32 is, for example, about 1.9 or more. The deficiency of oxygen of the second insulation layer 32 is lower than that of the first insulation layer 24.

The density of the positive charge of the second insulation layer 32 is lower than that of the first insulation layer 24.

In the off-state of the HEMT 200, positions at which a high electric field is concentrated, and at which trapping of electrons may readily occur, are near an end portion of the gate electrode 22 that is on the drain electrode 28 side of the gate electrode 22, and are near an end portion of the source field plate electrode 30 that is on the drain electrode 28 side of the source field plate electrode 30. In some embodiments according to the second aspect, the first insulation layer 24 containing positive fixed charge is selectively arranged under the source field plate electrode 30 and between the gate electrode 22 and the drain electrode 28. In other words, the first insulation layer 24 is selectively near or adjacent to an end of the gate electrode 22 on the drain electrode 28 side. As a result, current collapse can be effectively suppressed.

When the amount of the deficiency of oxygen included in the silicon oxide increases, there is a concern that the film quality of the silicon oxide is degraded. In a case where the film quality of the silicon oxide is degraded, there is a concern that the structural and/or functional reliability of the device is degraded due to penetration of water from the outside or the like.

In embodiments of the HEMT 200 according to the second aspect, the first insulation layer 24 having more deficiency of oxygen than the second insulation layer 32 is selectively arranged under the source field plate electrode 30, which can be formed using a metal having water permeability lower than silicon oxide or the like, and therefore better able to keep water or other potentially destructive substances out of the HEMT 200. Accordingly, the structural and/or functional reliability of the HEMT 200 can be increased.

As outlined above, according to the second aspect, a HEMT capable of suppressing current collapse is provided. In addition, a HEMT having increased structural and/or functional reliability is provided.

(Third Aspect)

Figure 5:
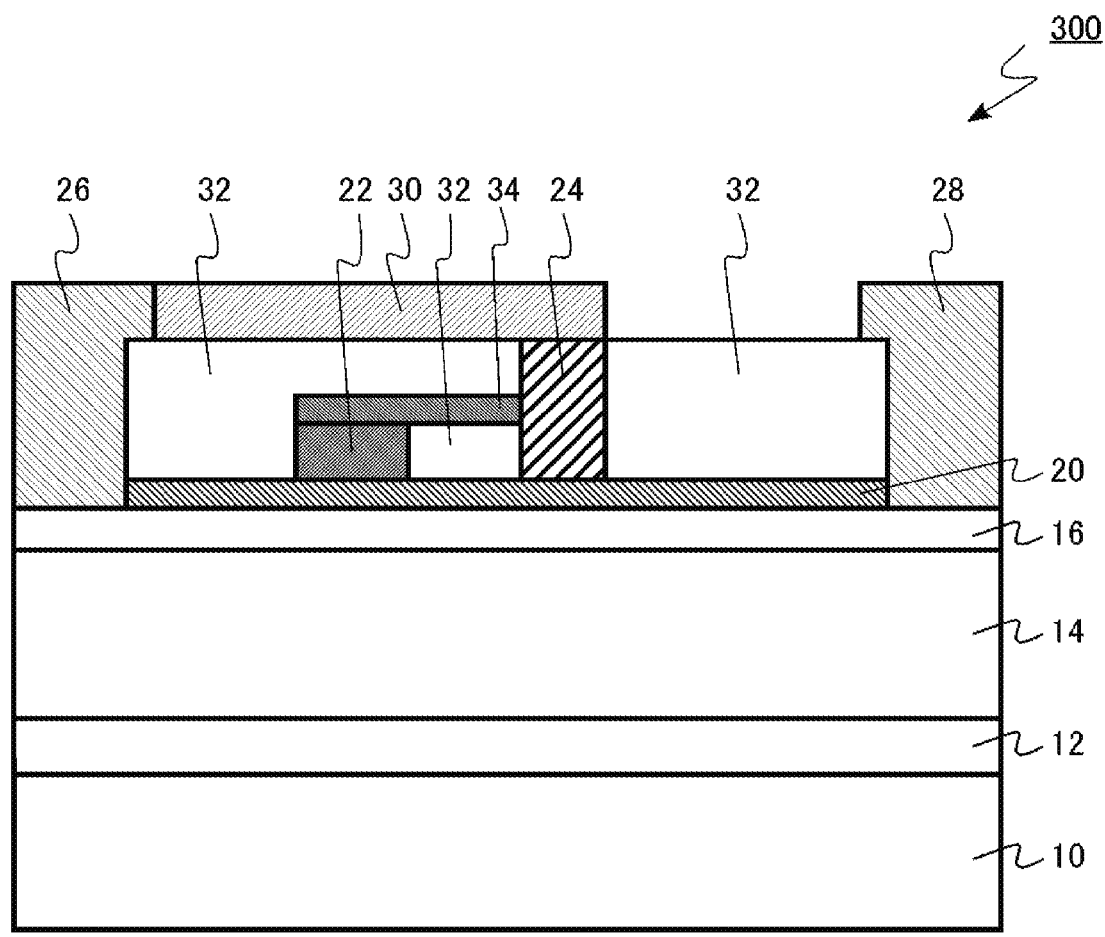
FIG. 5 is a schematic cross-sectional view of embodiments of a semiconductor device according to a third aspect.

In some embodiments, a semiconductor device according to a third aspect is similar to embodiments according to the second aspect, except that a fourth electrode is further included which is arranged between the second nitride semiconductor layer and the third electrode. Furthermore, an end portion of the fourth electrode on a second electrode side positioned between the gate electrode and an end portion of the third electrode on the second electrode side (e.g., as shown in FIG. 5, a right-hand end of a fourth electrode is at a horizontal location between a gate electrode and a right hand end of a third electrode, as discussed in more detail below), and the fourth electrode is further electrically connected to the gate electrode. Hereinafter, description of some components that are the same or similar to those described above with respect to the second aspect will be omitted.

FIG. 5 is a schematic cross-sectional view of some embodiments of a semiconductor device according to the third aspect. The semiconductor device according to the third aspect is a HEMT using a group III-V compound semiconductor.

As illustrated in FIG. 5, the HEMT 300 semiconductor device includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); a source field plate electrode 30 (third electrode); a second insulation layer 32; and a gate field plate electrode 34 (fourth electrode).

The gate field plate electrode 34 is arranged between the barrier layer 16 and the source field plate electrode 30. An end portion of the gate field plate electrode 34 that is arranged on the drain electrode 28 side is positioned between the gate electrode 22 and an end portion of the source field plate electrode 30 that is arranged on the drain electrode 28 side.

The gate field plate electrode 34 is electrically connected to the gate electrode 22. The gate field plate electrode 34 is physically connected to the gate electrode 22. The gate field plate electrode 34 has a same electric potential as the gate electrode 22.

The gate field plate electrode 34 can help to alleviate an intensity of an electric field between the source electrode 26 and the drain electrode 28. Accordingly, current collapse of the HEMT 300 is suppressed. In addition, the gate field plate electrode 34 can help to improve the off-breakdown voltage of the HEMT 300.

The gate field plate electrode 34 is, for example, a metal electrode. The source field plate electrode 30 has, for example, a stacked structure of platinum (Pt)/gold (Au).

In the HEMT 300 according to the third aspect, by including the gate field plate electrode 34, current collapse is further suppressed, as compared to some embodiments according to the second aspect. In addition, the off-breakdown voltage of the HEMT 300 is improved.

As outlined above, according to the third aspect, like the second aspect, a HEMT capable of suppressing the current collapse is provided. In addition, a HEMT of which the off-breakdown voltage is improved due to suppression of the current collapse is provided.

(Fourth Aspect)

In some embodiments, a semiconductor device according to a fourth aspect is similar to embodiments according to the third aspect, except that a third insulation layer is further included which is arranged between the second nitride semiconductor layer and the fourth electrode, and the third insulation layer includes silicon oxide having the oxygen-to-silicon atomic ratio (O/Si) of about 1.50 or more and about 1.85 or less. Hereinafter, description of some components that are the same or similar to those described above with respect to the third aspect will be omitted.

Figure 6:
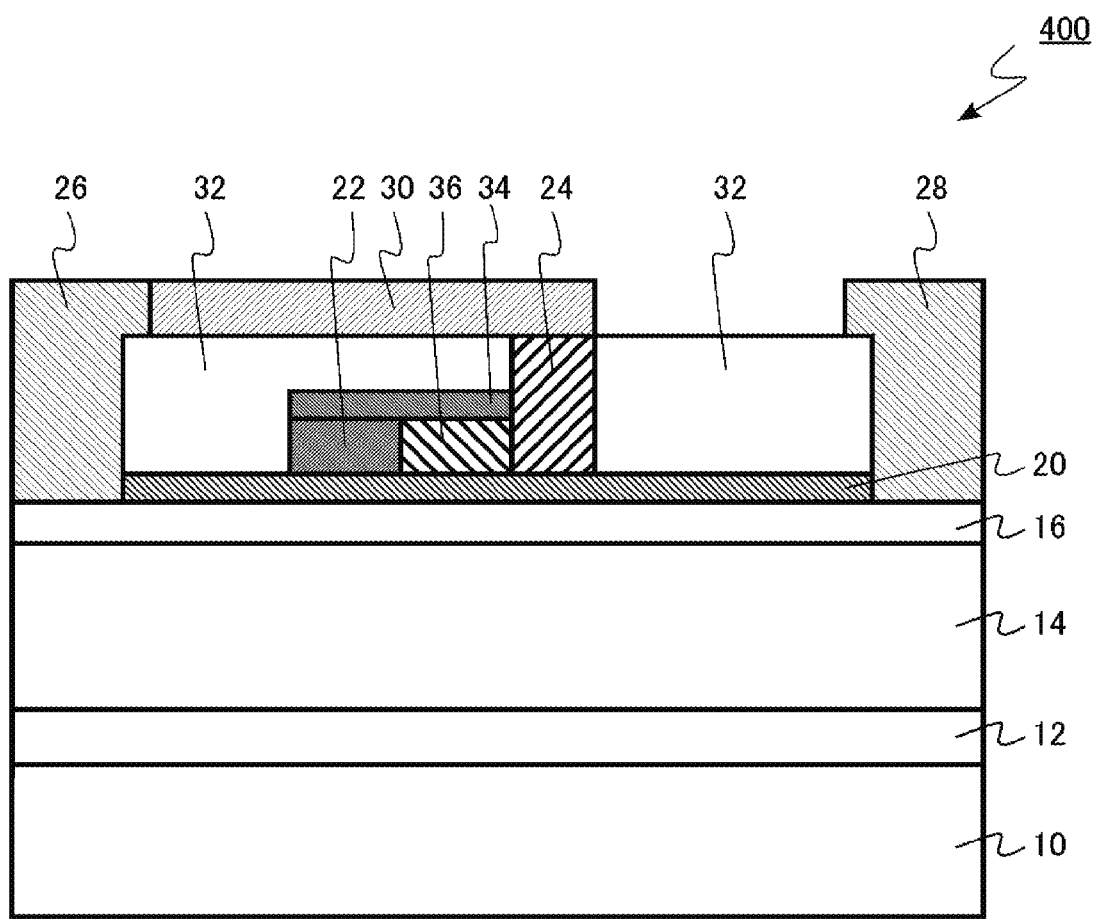
FIG. 6 is a schematic cross-sectional view of embodiments of a semiconductor device according to a fourth aspect.

FIG. 6 is a schematic cross-sectional view of some embodiments of a semiconductor device according to the fourth aspect. The semiconductor device according to the fourth aspect is a HEMT using a group III-V compound semiconductor.

As illustrated in FIG. 6, the HEMT 400 semiconductor device includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); a source field plate electrode 30 (third electrode); a second insulation layer 32; a gate field plate electrode 34 (fourth electrode); and a fourth insulation layer 36.

The fourth insulation layer 36 is arranged between the barrier layer 16 and the gate field plate electrode 34. The fourth insulation layer 36 is arranged on the gate insulation layer 20. The fourth insulation layer 36 is arranged between the gate electrode 22 and the first insulation layer 24.

The fourth insulation layer 36 is a silicon oxide layer. The fourth insulation layer 36 includes silicon oxide. The principal component of the fourth insulation layer 36 is silicon oxide (e.g., a majority, by weight, of the fourth insulation layer 36 is silicon oxide). The fourth insulation layer 36 may additionally include other materials.

The silicon oxide included in the fourth insulation layer 36 has an oxygen-to-silicon atomic ratio (O/Si) of about 1.50 or more and about 1.85 or less. The oxygen-to-silicon atomic ratio of the silicon oxide included in the fourth insulation layer 36 is less than 2 which corresponds to a stoichiometric composition of $SiO_2$. In the silicon oxide included in the fourth insulation layer 36, oxygen is deficient compared to a stoichiometric composition of $SiO_2$.

The silicon oxide layer that is the fourth insulation layer 36 includes positive charge inside the layer. The silicon oxide layer that is the fourth insulation layer 36 includes positive fixed charge inside the layer. The silicon oxide layer that is the fourth insulation layer 36 is positively charged.

The silicon oxide layer that is the fourth insulation layer 36 is, for example, formed using a CVD method. For example, for a CVD method involving a source gas of silicon and a source gas of oxygen, by setting a lower or reduced flow rate of the source gas of oxygen as compared to a flow rate used for forming $SiO_2$ having an oxygen-to-silicon atomic ratio of 2, a silicon oxide layer in which oxygen is deficient can be formed.

An oxygen-to-silicon atomic ratio of the silicon oxide included in the fourth insulation layer 36 can, for example, be acquired through calculation based on a measurement according to SIMS.

In the off-state of the HEMT 400, positions at which a high electric field is concentrated, and trapping of electrons may readily occur are near an end portion of the gate electrode 22 that is arranged on the drain electrode 28 side, near an end portion of the source field plate electrode 30 that is arranged on the drain electrode 28 side, and near an end portion of the gate field plate electrode 34 that is arranged on the drain electrode 28 side.

In the HEMT 400 according to the third aspect, under the gate field plate electrode 34, the fourth insulation layer 36 including positive fixed charge is further included. Accordingly, as compared to some embodiments according to the third aspect, current collapse is further suppressed.

As outlined above, according to the fourth aspect, like the third aspect, a HEMT capable of suppressing current collapse is provided. In addition, as compared to some embodiments according to the third aspect, a HEMT further suppressing current collapse is provided.

(Fifth Aspect)

In some embodiments, a semiconductor device according to a fifth aspect is similar to some embodiments according to the first aspect except that the gate insulation layer that is arranged between the second nitride semiconductor layer and the gate electrode and includes silicon oxide containing nitrogen is further included. Hereinafter, description of some components that are the same or similar to those described above with respect to the first aspect will be omitted.

Figure 7:
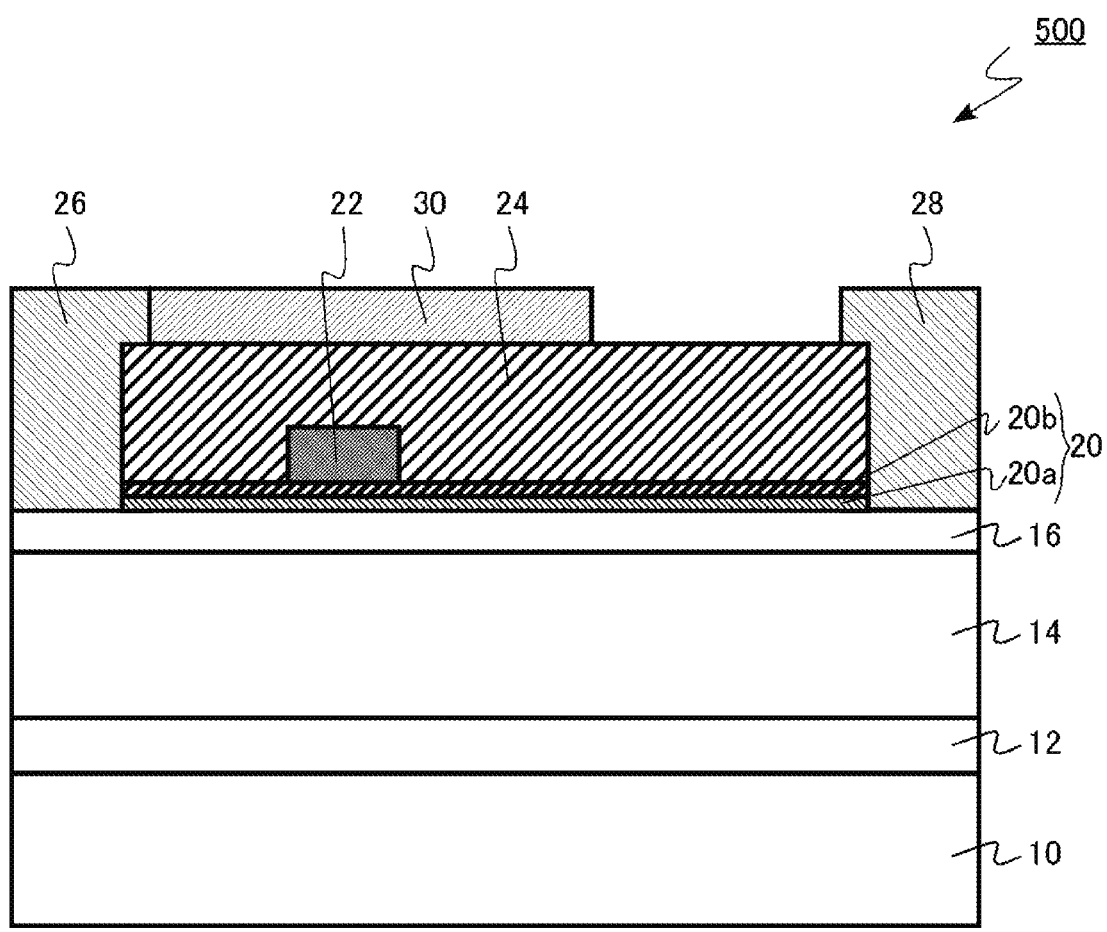
FIG. 7 is a schematic cross-sectional view of embodiments of a semiconductor device according to a fifth aspect.

FIG. 7 is a schematic cross-sectional view of embodiments of a semiconductor device according to the fifth aspect. The semiconductor device according to the first aspect is a HEMT using a group III-V compound semiconductor.

As illustrated in FIG. 7, the HEMT 500 semiconductor device includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); and a source field plate electrode 30 (third electrode).

The gate insulation layer 20 has a stacked structure of a first insulation film 20a and a second insulation film 20b.

The first insulation film 20a is, for example, formed using silicon nitride.

The second insulation film 20b is a silicon oxide film containing nitrogen. The second insulation film 20b includes silicon oxide containing nitrogen. The nitrogen-to-oxygen atomic ratio (N/O) of the silicon oxide included in the second insulation film 20b is, for example, about 0.1 or more and about 0.8 or less.

The second insulation film 20b includes nitrogen and thus, includes positive charge inside the film. The second insulation film 20b includes positive fixed charge inside the film. The second insulation film 20b is positively charged.

The second insulation film 20b can, for example, be formed by forming a silicon oxide film and then performing a heat treatment thereof in an ammonia ($NH_3$) atmosphere.

The nitrogen-to-oxygen atomic ratio (N/O) of the silicon oxide included in the second insulation film 20b can, for example, be acquired through calculation based on a measurement according to SIMS.

In embodiments of the HEMT 500 according to the fifth aspect, when the second insulation film 20b including positive fixed charge is used, the interface between the barrier layer 16 and the gate insulation layer 20 is filled with electrons in advance of stress being applied. Accordingly, as compared to the first embodiment, the current collapse is further suppressed.

In addition, the interface between the barrier layer 16 and the gate insulation layer 20 right below the gate electrode 22 is also filled with electrons in advance of stress being applied. Accordingly, a threshold voltage variation of the HEMT 500 according to the trapping of electrons right below the gate electrode 22 is also suppressed.

The nitrogen-to-oxygen atomic ratio (N/O) of the silicon oxide included in the second insulation film 20b is preferably about 0.1 or more and about 0.8 or less and is more preferably about 0.3 or more and about 0.6 or less. In a case where the atomic ratio is below the above-described range, there may be a concern that a sufficient effect of the suppression of current collapse and a sufficient effect of the suppression of threshold variations are not achieved. On the other hand, in a case where the atomic ratio is above the above-described range, there is a concern that a gate leak current exceeds an acceptable range.

As outlined above, in some embodiments according to the fifth aspect, like in embodiments according to the first aspect, a HEMT capable of suppressing current collapse is provided. In addition, a HEMT capable of suppressing threshold voltage variations is provided.

(Sixth Aspect)

Some embodiments of a semiconductor device according to a sixth aspect are similar to some embodiments according to the first aspect except that a third nitride semiconductor layer of a p type arranged between the second nitride semiconductor layer and the gate electrode is further included. Hereinafter, description of some components that are the same or similar to those described above with respect to the first aspect will be omitted.

Figure 8:
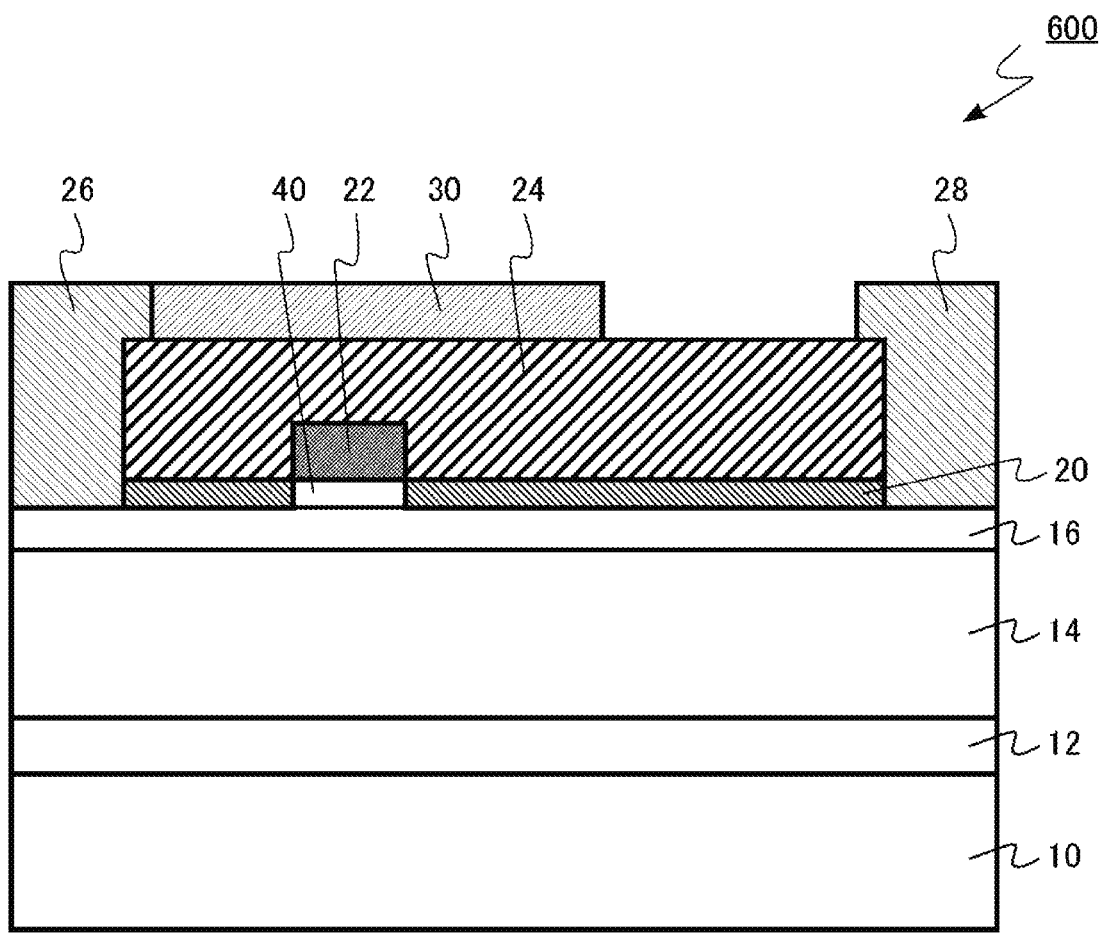
FIG. 8 is a schematic cross-sectional view of embodiments of a semiconductor device according to a sixth aspect.

FIG. 8 is a schematic cross-sectional view of some embodiments of a semiconductor device according to the sixth aspect. The semiconductor device according to the sixth aspect is a HEMT using a group III-V compound semiconductor.

As illustrated in FIG. 8, the HEMT 600 semiconductor device includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); a source field plate electrode 30 (third electrode); and a p-type layer 40 (third nitride semiconductor layer).

The p-type layer 40 is arranged between the barrier layer 16 and the gate electrode 22. The p-type layer 40 is arranged in contact with the barrier layer 16.

The p-type layer 40 is, for example, formed using gallium nitride (GaN) of the p-type.

The HEMT 600 according to the sixth aspect is a HEMT having a junction gate structure including the p-type layer 40. By including the p-type layer 40, a normally-off characteristic (a characteristic of being off by default) can be realized. By the normally-off characteristic, a current does not flow between the source and the drain in a state in which a voltage is not applied to the gate electrode.

As outlined above, in some embodiments according to the sixth aspect, as in some embodiments according to the first aspect, a HEMT capable of suppressing current collapse is provided. In addition, a HEMT capable of realizing the normally-off characteristic is provided.

(Seventh Aspect)

Some embodiments of a semiconductor device according to a seventh aspect include: a first nitride semiconductor layer; a second nitride semiconductor layer that is arranged on the first nitride semiconductor layer and has a band gap larger than the first nitride semiconductor layer; a gate electrode that is arranged on the first nitride semiconductor layer; a first electrode that is electrically connected to the first nitride semiconductor layer; a second electrode that allows the gate electrode to be positioned between the first electrode and the second electrode, and is electrically connected to the first nitride semiconductor layer; a first insulation layer that is arranged between the gate electrode and the second electrode, allows the second nitride semiconductor layer to be positioned between the first nitride semiconductor layer and the first insulation layer, and includes silicon oxide containing nitrogen; and a second insulation layer that is arranged between the first insulation layer and the second electrode and includes silicon oxide having a nitrogen density lower than the silicon oxide included in the first insulation layer.

Some embodiments of a semiconductor device according to the seventh aspect are similar to some embodiments according to the second aspect except that a material of the first insulation layer is different in at least some respects. Hereinafter, description of some components that are the same or similar to those described above with respect to the second aspect will be omitted.

Figure 9:
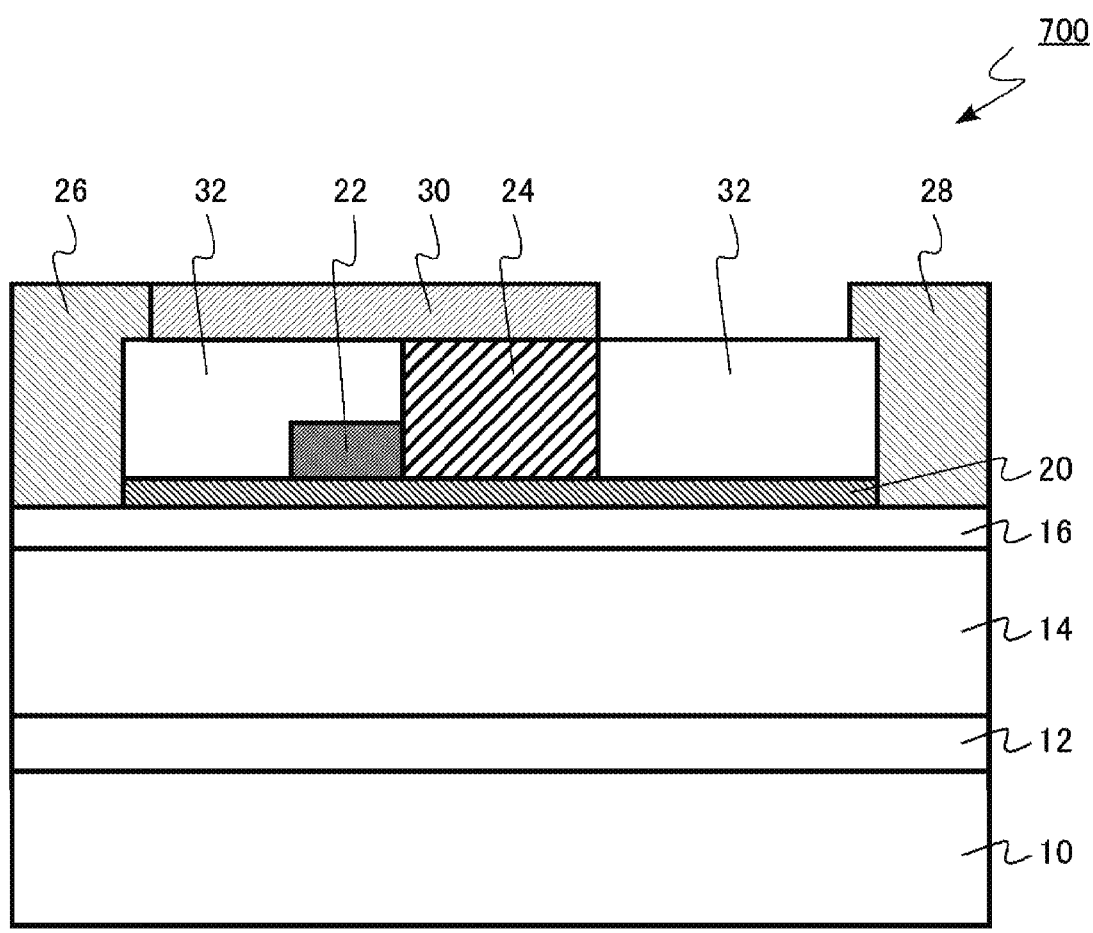
FIG. 9 is a schematic cross-sectional view of embodiments of a semiconductor device according to a seventh aspect.

FIG. 9 is a schematic cross-sectional view of some embodiments of a semiconductor device according to the seventh aspect. The semiconductor device according to the seventh aspect is a HEMT using a group III-V compound semiconductor.

As illustrated in FIG. 9, the HEMT 700 semiconductor device includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); a source field plate electrode 30 (third electrode); and a second insulation layer 32.

The first insulation layer 24 is arranged between an end portion of the gate electrode 22 that is arranged on the drain electrode 28 side and an end portion of the source field plate electrode 30 that is arranged on the drain electrode 28 side, and is interposed between the source field plate electrode 30 and the barrier layer 16. In some embodiments, the first insulation layer 24 is selectively arranged in an area between the gate electrode 22 and the drain electrode 28. In some embodiments, the first insulation layer 24 is selectively arranged in an area below the source field plate electrode 30.

The first insulation layer 24 is a silicon oxide layer. The first insulation layer 24 includes silicon oxide. The principal component of the first insulation layer 24 is silicon oxide (e.g., a majority, by weight, of the first insulation layer 24 is silicon oxide). The first insulation layer 24 may additionally include other materials.

The first insulation layer 24 is a silicon oxide layer containing nitrogen. The first insulation layer 24 includes silicon oxide containing nitrogen. The nitrogen-to-oxygen atomic ratio (N/O) of the silicon oxide included in the first insulation layer 24 is, for example, about 0.1 or more and about 0.8 or less.

The first insulation layer 24 includes nitrogen, and thus includes positive charge inside the layer. The first insulation layer 24 includes positive fixed charge inside the layer. The first insulation layer 24 is positively charged.

A portion of the second insulation layer 32 is arranged between the first insulation layer 24 and the drain electrode 28. In addition, a portion of the second insulation layer 32 is arranged between the first insulation layer 24 and the source electrode 26. At least a portion of the first insulation layer 24 is arranged on the gate insulation layer 20.

The second insulation layer 32 is a silicon oxide layer. The second insulation layer 32 includes silicon oxide. The principal component of the second insulation layer 32 is silicon oxide (e.g., a majority, by weight, of the second insulation layer 32 is silicon oxide). The second insulation layer 32 may additionally include other materials.

The density of nitrogen of the silicon oxide included in the second insulation layer 32 is lower than that of silicon oxide included in the first insulation layer 24. In other words, the nitrogen-to-oxygen atomic ratio (N/O) of the silicon oxide included in the second insulation layer 32 is lower than that of the silicon oxide included in the first insulation layer 24. The nitrogen-to-oxygen atomic ratio (N/O) of the silicon oxide included in the second insulation layer 32 is, for example, about zero or more and less than about 0.1.

The density of positive charge of the second insulation layer 32 is lower than that of the first insulation layer 24.

The nitrogen-to-oxygen atomic ratios (N/O) of the silicon oxide included in the first insulation layer 24 and the second insulation layer 32 can, for example, be acquired through calculation based on measurements according to SIMS. The densities of nitrogen of the silicon oxide included in the first insulation layer 24 and the second insulation layer 32 can, for example, be acquired through measurements according to SIMS. The magnitude relation between the densities of nitrogen included in the silicon oxide included in the first insulation layer 24 and the second insulation layer 32 can, for example, be measured using electron energy loss spectroscopy (EELS).

In some embodiments of the HEMT 700 according to the seventh aspect, like in some embodiments according to the second aspect, as the first insulation layer 24 includes positive fixed charge inside the layer, current collapse can be suppressed. However, since silicon oxide containing nitrogen can correspond to an increased leak current, in a case where the silicon oxide is applied to an insulation layer, there is a concern that device characteristics of the HEMT 700 such as a standby current and power consumption are degraded.

In the off-state of the HEMT 700, positions at which a high electric field is concentrated, and trapping of electrons may readily occur are near an end portion of the gate electrode 22 that is arranged on the drain electrode 28 side and near an end portion of the source field plate electrode 30 that is arranged on the drain electrode 28 side. In some embodiments according to the seventh aspect, in the HEMT 700, in an area located near such positions, the first insulation layer 24 including positive fixed charge is selectively arranged. Accordingly, current collapse can be effectively suppressed without degrading some other device characteristics.

The nitrogen-to-oxygen atomic ratio (N/O) of the silicon oxide included in the first insulation layer 24 is preferably about 0.1 or more and about 0.8 or less and is more preferably about 0.3 or more and about 0.6 or less. In a case where the atomic ratio is below the above-described range, there is a concern that a sufficient effect of the suppression of current collapse and a sufficient effect of the suppression of threshold variations are not achieved. On the other hand, in a case where the atomic ratio is above the above-described range, there is a concern that a leak current of the insulation layer exceeds an acceptable range.

As outlined above, in some embodiments according to the seventh aspect, like in some embodiments according to the second aspect, a HEMT capable of suppressing current collapse is provided. In addition, a HEMT capable of suppressing the degradation of the device characteristics is provided.

Eighth Embodiment

In some embodiments, a semiconductor device according to an eighth aspect is similar to some embodiments according to the seventh aspect except that a gate insulation layer is further included which is arranged between a second nitride semiconductor layer and a gate electrode and includes silicon oxide containing nitrogen. Hereinafter, description of some components that are the same or similar to those described above with respect to the seventh aspect will be omitted.

Figure 10:
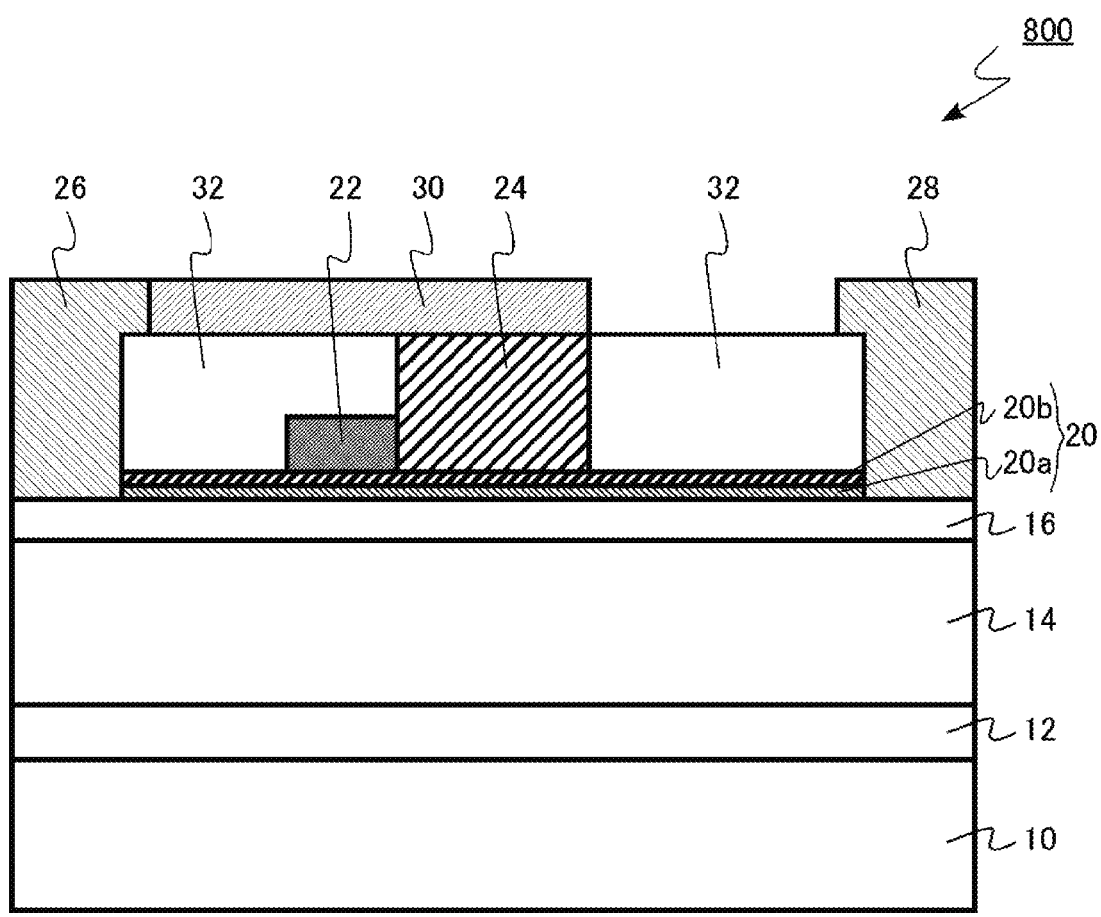
FIG. 10 is a schematic cross-sectional view of embodiments of a semiconductor device according to an eighth aspect.

FIG. 10 is a schematic cross-sectional view of some embodiments of a semiconductor device according to the eighth aspect. The semiconductor device according to the eighth aspect is a HEMT using a group III-V compound semiconductor.

As illustrated in FIG. 10, the HEMT 800 semiconductor device includes: a substrate 10; a buffer layer 12; a channel layer 14 (first nitride semiconductor layer); a barrier layer 16 (second nitride semiconductor layer); a gate insulation layer 20; a gate electrode 22; a first insulation layer 24; a source electrode 26 (first electrode); a drain electrode 28 (second electrode); a source field plate electrode 30 (third electrode); and a second insulation layer 32.

The gate insulation layer 20 has a stacked structure of a first insulation film 20a and a second insulation film 20b.

The first insulation film 20a is, for example, formed using silicon nitride.

The second insulation film 20b is a silicon oxide film containing nitrogen. The second insulation film 20b includes silicon oxide containing nitrogen. The nitrogen-to-oxygen atomic ratio (N/O) of the silicon oxide included in the second insulation film 20b is, for example, about 0.1 or more and about 0.8 or less.

The second insulation film 20b includes nitrogen and thus, includes positive charge inside the film. The second insulation film 20b includes positive fixed charge inside the film. The second insulation film 20b is positively charged.

The silicon oxide film containing nitrogen can be, for example, formed by forming a silicon oxide film and then, performing a heat treatment thereof in an ammonia ($NH_3$) atmosphere.

The nitrogen-to-oxygen atomic ratio (N/O) of the silicon oxide included in the second insulation film 20b can be, for example, acquired through calculation based on a measurement according to SIMS.

In some embodiments of the HEMT 800 according to the eighth aspect, when the second insulation film 20b including positive fixed charge is used, the interface between the barrier layer 16 and the gate insulation layer 20 is filled with electrons in advance of a stress being applied. Accordingly, as compared to some embodiments according to the first aspect, the current collapse is further suppressed.

In addition, the interface between the barrier layer 16 and the gate insulation layer 20 immediately below the gate electrode 22 is also filled with electrons in advance of stress being applied. Accordingly, a threshold voltage variation of the HEMT 800 due to the trapping of electrons immediately below the gate electrode 22 is also suppressed.

The nitrogen-to-oxygen atomic ratio (N/O) of the silicon oxide included in the second insulation film 20b is preferably about 0.1 or more and about 0.8 or less and is more preferably about 0.3 or more and about 0.6 or less. In a case where the atomic ratio is below the above-described range, there is a concern that a sufficient effect of the suppression of current collapse and a sufficient effect of the suppression of threshold variations are not obtained. On the other hand, in a case where the atomic ratio is above the above-described range, there is a concern that a gate leak current exceeds an acceptable range.

As outlined above, in some embodiments according to the eighth aspect, like in some embodiments according to the seventh aspect, a HEMT capable of suppressing current collapse is provided. In addition, a HEMT capable of suppressing threshold voltage variations is provided.

Some embodiments according to the second aspect in which the silicon oxide layer having an oxygen-to-silicon atomic ratio (O/Si) of about 1.50 or more and about 1.85 or less as the insulation layer including positive charge have been described. Some embodiments according to the seventh aspect in which the silicon oxide layer containing nitrogen as the insulation layer including positive charge have been described. By changing such materials, other insulation layers including positive charge may be implemented. An insulation layer including positive charge can be implemented based on the material of the insulation layer.

In some embodiments according to the first through eighth aspects, while gallium nitride or aluminum gallium nitride has been described as the material of the nitride semiconductor layer by way of example, other materials may be alternatively or additionally implemented, such as indium gallium nitride, indium aluminum nitride, and/or indium aluminum gallium nitride containing indium (In). In some embodiments, aluminum nitride may be applied as the material of the nitride semiconductor layer.

In embodiments according to the first to eighth aspects, while undoped aluminum gallium nitride has been described byway of example as the material of the barrier layer 16, other materials may be alternatively or additionally implemented, such as aluminum gallium nitride of the n-type.

Some embodiments according to the first to eighth aspects in which the gate insulation layer 20 is arranged between the barrier layer 16 and the first insulation layer 24 have been described. However, in some embodiments a configuration in which the first insulation layer 24 is directly in contact with the barrier layer 16 may be employed.

In some embodiments according to the first to eighth aspects, the HEMT having a planar gate structure including the gate insulation layer or the HEMT having the junction gate structure including the p-type layer have been described by way of example. However, in some embodiments the HEMT may have any other structure appropriate structure such as a HEMT having a Schottky gate structure or a HEMT having a recess gate structure including a gate electrode inside a recess arranged in a channel layer or a barrier layer.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor device comprising: a first nitride semiconductor layer; a second nitride semiconductor layer that is provided on the first nitride semiconductor layer and has a band gap larger than a band gap of the first nitride semiconductor layer; a gate electrode that is provided on the first nitride semiconductor layer; a first electrode that is electrically connected to the first nitride semiconductor layer; a second electrode disposed such that the gate electrode is positioned between the first electrode and the second electrode, and electrically connected to the first nitride semiconductor layer; and a first insulation layer that is provided between the gate electrode and the second electrode, disposed such that the second nitride semiconductor layer is positioned between the first nitride semiconductor layer and the first insulation layer, and including silicon oxide having an oxygen-to-silicon atomic ratio (O/Si) of 1.50 or more and 1.85 or less; a second insulation layer that is provided between the first insulation layer and the second electrode, wherein the second insulation layer is disposed such that the second nitride semiconductor layer is positioned between the first nitride semiconductor layer and the second insulation layer.

2. The semiconductor device according to claim 1, further comprising, and including silicon oxide having an oxygen-to-silicon atomic ratio higher than the oxygen-to-silicon atmoic ratio of the first insulation layer.

3. The semiconductor device according to claim 1, further comprising a third electrode disposed such that the gate electrode and the first insulation layer are positioned between the second nitride semiconductor layer and the third electrode, and electrically connected to the first electrode.

4. The semiconductor device according to claim 3, further comprising a fourth electrode that is provided between the second nitride semiconductor layer and the third electrode, has an end portion provided on a second electrode side positioned between the gate electrode and an end portion of the third electrode provided on the second electrode side, and is electrically connected to the gate electrode.

5. The semiconductor device according to claim 4, further comprising a third insulation layer that is provided between the second nitride semiconductor layer and the fourth electrode and includes silicon oxide having an oxygen-to-silicon atomic ratio (O/Si) of 1.50 or more and 1.85 or less.

6. The semiconductor device according to claim 1, further comprising a gate insulation layer that is provided between the second nitride semiconductor layer and the gate electrode and includes silicon oxide containing nitrogen.

7. A semiconductor device comprising: a first nitride semiconductor layer; a second nitride semiconductor layer that is provided on the first nitride semiconductor layer and has a band gap larger than a band gap of the first nitride semiconductor layer; a gate electrode that is provided on the first nitride semiconductor layer; a first electrode that is electrically connected to the first nitride semiconductor layer; a second electrode disposed such that the gate electrode is positioned between the first electrode and the second electrode, and electrically connected to the first nitride semiconductor layer; a first insulation layer that is provided between the gate electrode and the second electrode, disposed such that the second nitride semiconductor layer is positioned between the first nitride semiconductor layer and the first insulation layer, and including silicon oxide containing nitrogen; and a second insulation layer that is provided between the first insulation layer and the second electrode and includes silicon oxide having a density of nitrogen lower than the silicon oxide included in the first insulation layer; a gate insulation layer that is provided between the second nitride semiconductor layer and the gate electrode and includes silicon oxide containing nitrogen.

8. The semiconductor device according to claim 7, further comprising a third electrode disposed such that the gate electrode and the first insulation layer are positioned between the second nitride semiconductor layer and the third electrode, and electrically connected to the first electrode.

9. A semiconductor device comprising: a first nitride semiconductor layer; a second nitride semiconductor layer that is provided on the first nitride semiconductor layer and has a band gap larger than a band gap of the first nitride semiconductor layer; a gate electrode that is provided on the first nitride semiconductor layer; a first electrode that is electrically connected to the first nitride semiconductor layer; a second electrode disposed such that the gate electrode is positioned between the first electrode and the second electrode, and electrically connected to the first nitride semiconductor layer; a first insulation layer that is provided between the gate electrode and the second electrode, disposed such that the second nitride semiconductor layer is positioned between the first nitride semiconductor layer and the first insulation layer, and containing positive charge; and a second insulation layer that is provided between the first insulation layer and the second electrode, disposed such that the second nitride semiconductor layer is positioned between the first nitride semiconductor layer and the second insulation layer, and having a density of positive charge lower than that of the first insulation layer a gate insulation layer that is provided between the second nitride semiconductor layer and the gate electrode and contains positive charge.

10. The semiconductor device according to claim 9, further comprising a third electrode disposed such that the gate electrode and the first insulation layer are positioned between the second nitride semiconductor layer and the third electrode, and electrically connected to the first electrode.

* * * * *